(12) United States Patent
Ali et al.

(10) Patent No.: US 8,017,493 B2
(45) Date of Patent: Sep. 13, 2011

(54) METHOD OF PLANARIZING A SEMICONDUCTOR DEVICE

(75) Inventors: Abbas Ali, Plano, TX (US); Seetharaman Sridhar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 12/436,973

(22) Filed: May 7, 2009

(65) Prior Publication Data

US 2009/0280618 A1 Nov. 12, 2009

Related U.S. Application Data

(60) Provisional application No. 61/052,293, filed on May 12, 2008.

(51) Int. Cl.
*H01L 21/8238* (2006.01)

(52) U.S. Cl. ........ 438/424; 438/591; 438/589; 438/303; 438/301; 257/306; 257/301; 257/305; 257/E21.546

(58) Field of Classification Search .................. 438/424, 438/640, 689, 296, 404, 591, 589, 303, 301; 257/306, 301, 305, E21.546
See application file for complete search history.

(56) References Cited

U.S. PATENT DOCUMENTS

| 4,654,120 | A | * | 3/1987 | Dougherty | 438/424 |
| 6,080,628 | A | * | 6/2000 | Cherng | 438/296 |
| 6,720,606 | B1 | * | 4/2004 | Nitayama et al. | 257/306 |
| 6,790,756 | B2 | * | 9/2004 | Hu et al. | 438/591 |
| 2009/0090958 | A1 | * | 4/2009 | Keller et al. | 257/316 |
| 2009/0239375 | A1 | * | 9/2009 | Riess et al. | 438/640 |

\* cited by examiner

*Primary Examiner* — Matthew Smith
*Assistant Examiner* — Wilner Jean Baptiste
(74) *Attorney, Agent, or Firm* — Jacqueline J. Garner; Wade J. Brady, III; Frederick J. Telecky, Jr.

(57) ABSTRACT

A process of forming a semiconductor process fabricated device which contains a trench, hole or gap filled with a conformally deposited material is disclosed. A sacrificial planarizing layer is formed on the fill material, and the device is planarized using a selective RIE process which etches the fill material faster than the sacrificial planarizing layer. An overetch step completes the planarization process.

10 Claims, 5 Drawing Sheets

METHOD OF PLANARIZING A SEMICONDUCTOR DEVICE

FIELD OF THE INVENTION

This invention relates to the field of integrated circuits. More particularly, this invention relates to methods of planarizing integrated circuits.

BACKGROUND OF THE INVENTION

Integrated circuits may include topographical features such as trenches, holes or gaps between structures, which may be filled with material so that a top surface of the fill material is not planar. It may be desirable to planarize the top surface of the fill material. Planarization methods such as chemical mechanical polishing (CMP) or etchback may not provide a desired extent of planarization.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor process fabricated device may have a cavity such as a trench or a hole or a gap filled with a material which is deposited using a conformal process, so that a top surface of the fill material has a depression over the cavity. The semiconductor process fabricated device may be planarized by forming a planarization layer of a sacrificial material on the fill material, and performing an etch process with an etch rate of the fill material that is greater than five times an etch rate of the planarizing material. After the fill material is removed from surfaces adjacent to the cavity, an overetch is performed to planarize a raised region of the fill material over the cavity.

DETAILED DESCRIPTION

Figure 1A:
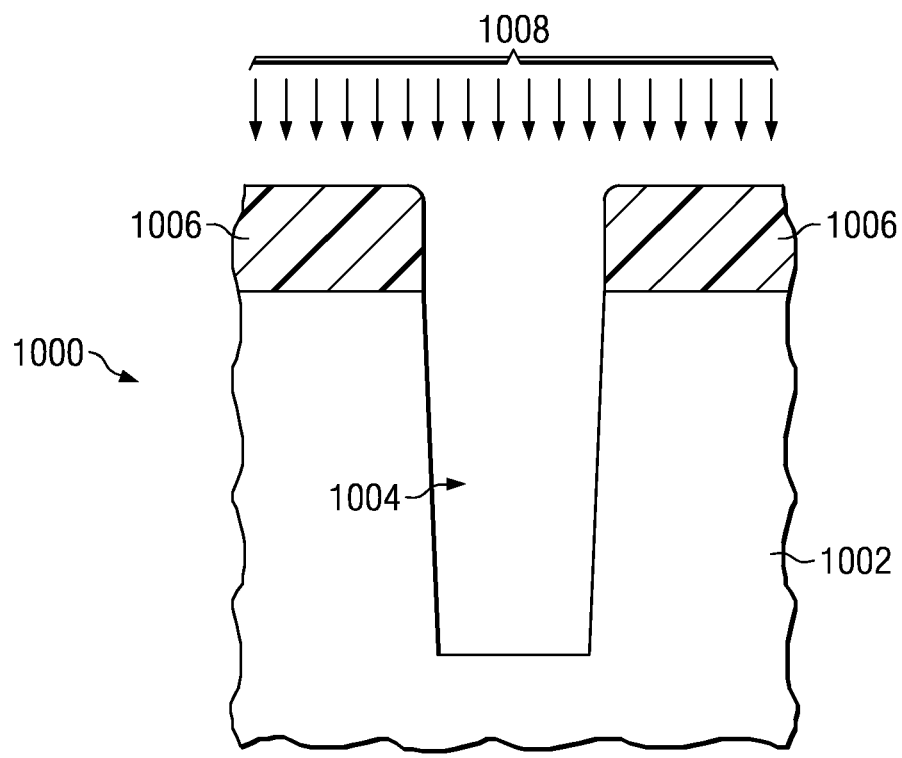
FIG. 1A through FIG. 1J are cross-sections of an semiconductor process fabricated device containing a cavity which is filled using a conformal deposition process and planarized according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For purposes of improving readability of this specification, the term "semiconductor process fabricated device" will be used throughout, and will be understood to refer to an integrated circuit, a micro-electrical-mechanical system (MEMS) device or any other device fabricated with using process steps typically associated with manufacturing an integrated circuit.

A semiconductor process fabricated device may be formed by forming a cavity such as a trench or hole in a substrate or layer of the semiconductor process fabricated device, or a gap between structures on the semiconductor process fabricated device, and subsequently filling the gap with a material which is deposited using a conformal process, so that a top surface of the fill material has a depression over the cavity. The semiconductor process fabricated device may be planarized by forming a planarization layer of a sacrificial material on the fill material, and performing an etch process with an etch rate of the fill material that is greater than five times an etch rate of the planarizing material. After the fill material is removed from surfaces adjacent to the cavity, an overetch is performed to planarize a raised region of the fill material over the cavity.

FIG. 1A through FIG. 1J are cross-sections of an semiconductor process fabricated device containing a cavity which is filled using a conformal deposition process and planarized according to an embodiment, depicted in successive stages of fabrication. Referring to FIG. 1A, the semiconductor process fabricated device (1000) is formed in and on a substrate (1002), which may be a single crystal silicon wafer, a silicon-on-insulator (SOI) wafer, a hybrid orientation technology (HOT) wafer with regions of different crystal orientations, or other material appropriate for fabrication of the semiconductor process fabricated device (1000). In some embodiments, the substrate (1002) may contain other semiconductor material besides silicon, such as silicon carbide, zinc selenide, gallium arsenide, gallium nitride, cadmium telluride or mercury cadmium telluride. In other embodiments, the substrate (1002) may include quartz, amorphous silicon dioxide, aluminum oxide, lithium niobate or other insulating material. The substrate (1002) may include layers (not shown in FIG. 1A for clarity) of dielectric material or conductive material over the semiconductor material. The dielectric material, if present, may include silicon dioxide, silicon nitride, silicon oxy-nitride, aluminum oxide, silicon carbide nitride, organo-silicate glass (OSG), carbon-doped silicon oxides (SiCO or CDO) or methylsilsesquioxane (MSQ), porous OSG (p-OSG) or other electrically insulating material. The conductive material, if present, may include polycrystalline silicon commonly known as polysilicon, metal silicide, titanium nitride, tungsten, tantalum nitride, aluminum, copper, gold, or other electrically conducting material.

A cavity (1004) is formed in or on the substrate (1002). In one realization of the instant embodiment, as depicted in FIG. 1A, a cavity photoresist pattern (1006) is formed over the substrate (1002). The cavity photoresist pattern (1006) defines an area for the cavity (1004) by exposing a top surface of the substrate (1002). A cavity formation process (1008), which may be, for example, a reactive ion etch (RIE) process or a wet etch process, removes material from the substrate (1002) in the area defined for the cavity (1004). The cavity photoresist pattern (1006) may subsequently be removed, for example by exposing the semiconductor process fabricated device (1000) to an oxygen containing plasma, followed by a wet cleanup to remove any organic residue from the top surface of the substrate (1002). The cavity (1004) may be a hole in some realizations, or a trench in other realizations. In one realization, the cavity (1004) may be part of a deep trench isolation structure, in which the cavity (1004) is a trench more than one micron wide and more than three microns deep. In another realization, the cavity (1004) may be part of a shallow trench isolation (STI) structure, in which the trench is less than one micron deep.

In an alternate realization of the instant embodiment, the cavity (1004) may be formed by fabricating one or more structures (not shown in FIG. 1A) on the substrate (1002) so that the cavity (1004) is formed by a gap between the structures. The structures may be, for example, gates of metal oxide semiconductor (MOS) transistors. For the purposes of this specification, structures which constitute sidewalls of the cavity (1004) will be considered part of the substrate (1002) hereafter.

In some realizations of the instant embodiment, one or more layers (not shown in FIG. 1A for clarity) may be formed on the top surface of the substrate (1002), on sidewalls of the cavity (1004), on a bottom surface of the cavity (1004) or in any combination thereof. The layers may include dielectric materials such as silicon dioxide or silicon nitride. The layers may include electrical conductors such as titanium, titanium nitride, tantalum, or tantalum nitride.

Figure 1B:
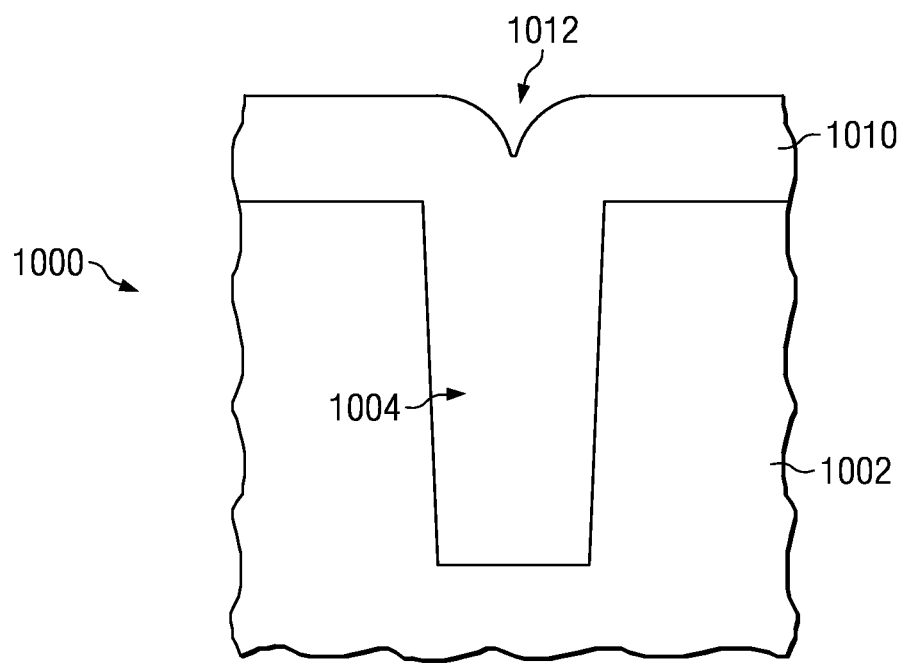

Referring to FIG. 1B, a layer of fill material (1010) is formed in the cavity (1004) and on an existing top surface of the substrate (1002) adjacent to the cavity (1004). The fill material layer (1010) is formed using a conformal deposition process, such as chemical vapor deposition (CVD), plasma enhanced chemical vapor deposition (PECVD), low pressure chemical vapor deposition (LPCVD), atmospheric pressure chemical vapor deposition (APCVD), atomic layer deposition (ALD) or other suitable conformal deposition process. In a conformal deposition process, a thickness of deposited material on a vertical surface, such as the sidewalls of the cavity (1004), is a significant fraction, commonly greater than 50%, of a thickness of the deposited material on a horizontal surface, such as the top surface of the substrate (1002). Conformal deposition of the fill material layer (1010) results in a depression (1012) in a top surface of the fill material layer (1010) over the cavity (1004).

In one realization of the instant embodiment, the fill material layer (1010) may be polysilicon. In an alternate realization, the fill material layer (1010) may be silicon dioxide. In a further realization, the fill material layer (1010) may include another dielectric material, such as silicon nitride or silicon oxy-nitride. In yet another realization, the fill material layer (1010) may be an electrically conducting material such as tungsten.

Figure 1C:
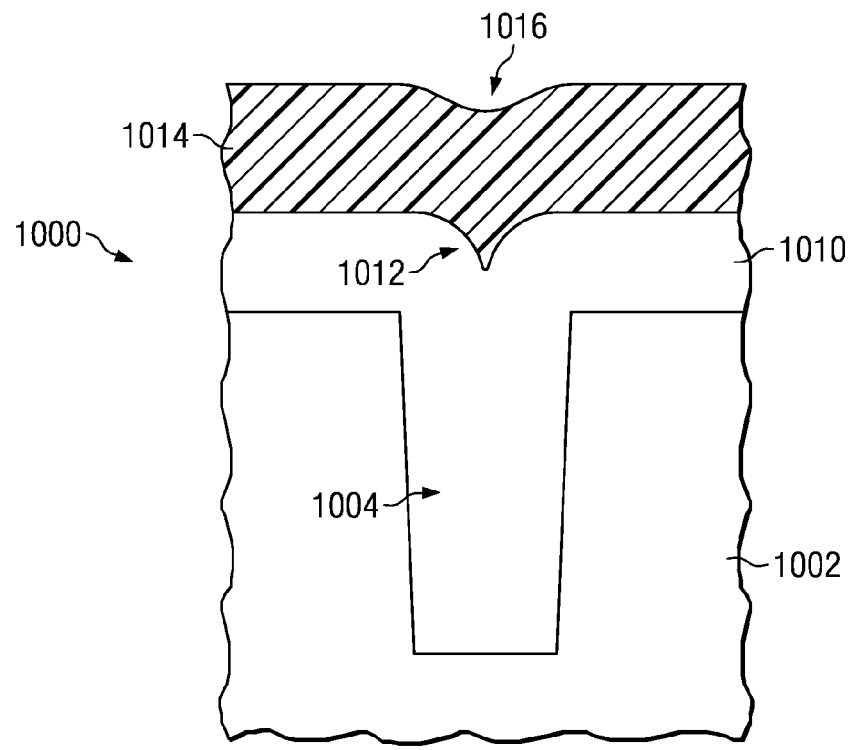

Referring to FIG. 1C, a sacrificial planarizing layer (1014) is formed on a top surface of the fill material layer (1010). A top surface of the sacrificial planarizing layer (1014) may include a depression (1016) over the cavity (1004). A thickness of the sacrificial planarizing layer (1014) over a center of the cavity (1004) is greater than a thickness of the sacrificial planarizing layer (1014) over the substrate (1002) adjacent to the cavity (1004), by at least half a depth of the fill layer depression (1012).

In one realization of the instant embodiment, the sacrificial planarizing layer (1014) may include photoresist, and be formed by dispensing a mixture of photoresist and solvent onto an area of the top surface of the fill material layer (1010) and subsequently spinning the substrate (1002) to distribute the photoresist over the top surface of the fill material layer (1010). In an alternate realization, the sacrificial planarizing layer (1014) may include an organic polymer commonly used for anti-reflection layers in photolithography processes and commonly referred to as bottom anti-reflection coating (BARC), and a solvent, and be formed by a process analogous to the process recited above for forming the sacrificial planarizing layer (1014) including photoresist. In yet another realization, the sacrificial planarizing layer (1014) may include a spin-on glass (SOG), and be formed by dispensing a mixture of SOG and solvent onto an area of the top surface of the fill material layer (1010), spinning the substrate (1002) to distribute the SOG over the top surface of the fill material layer (1010), and subsequently baking the substrate (1002) to remove solvent from the sacrificial planarizing layer (1014).

Figure 1D:
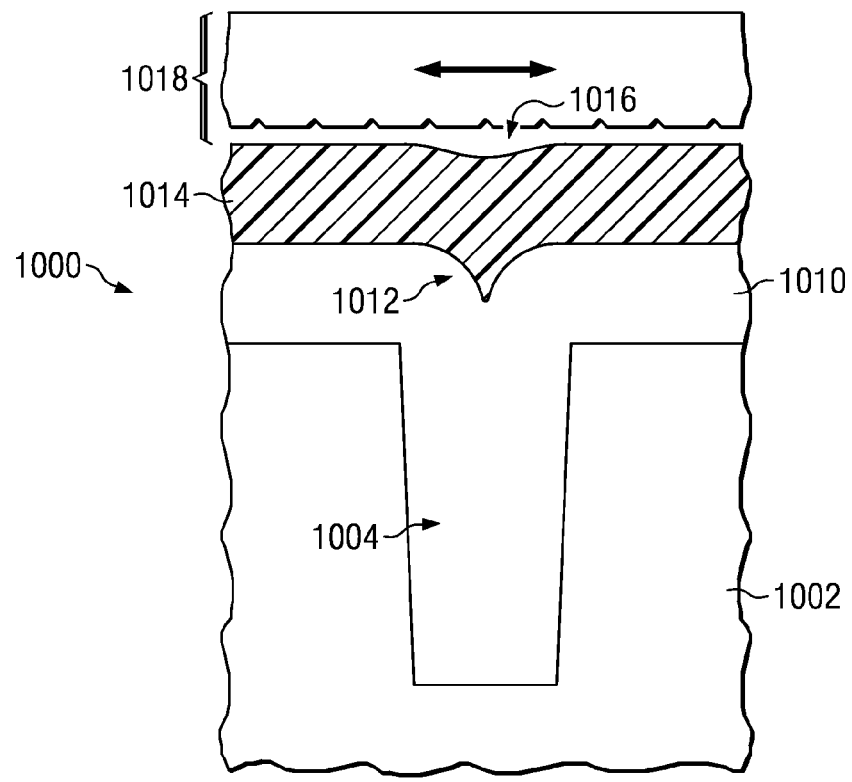

Referring to FIG. 1D, an optional smoothing process (1018), such as a CMP process as depicted schematically in FIG. 1D, may be performed on the sacrificial planarizing layer (1014) to reduce a depth of the sacrificial planarizing layer depression (1016), if present.

Figure 1E:
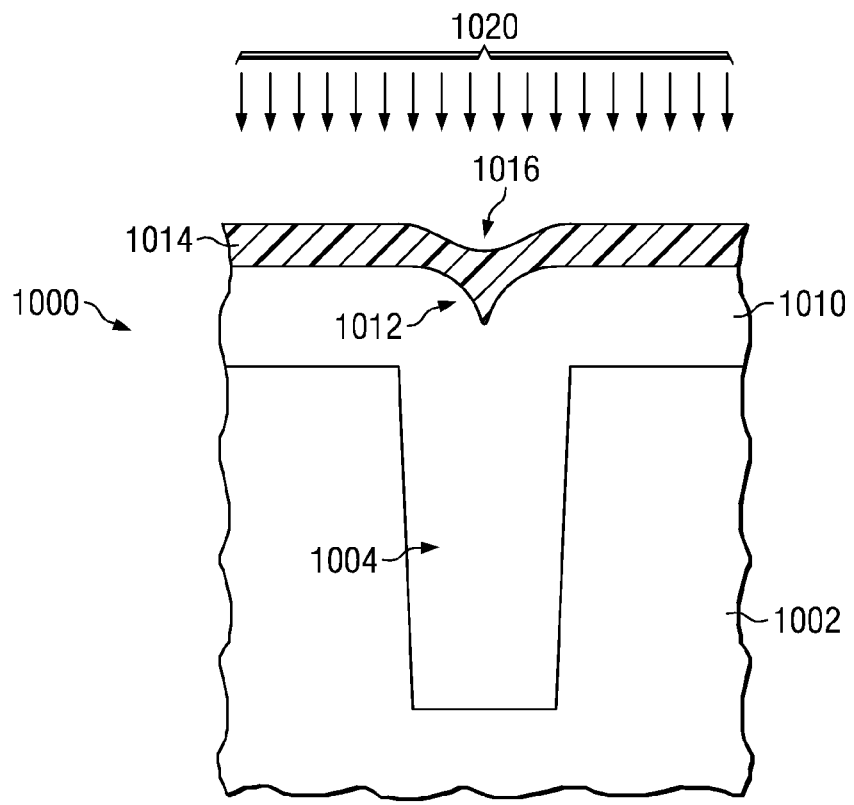

Referring to FIG. 1E, an optional planarization layer bulk removal process (1020) may be performed which removes a fraction, but not all, of the sacrificial planarizing layer (1014). In one realization of the instant embodiment, the planarization layer bulk removal process (1020) may be an RIE process. For example, in realizations in which the sacrificial planarizing layer (1014) includes organic polymers such as photoresist or BARC, a an inductively coupled or capacitively coupled plasma for an RIE planarization layer bulk removal process may be formed by flowing 0 to 300 standard cubic centimeters per minute (sccm) of a noble gas such as argon, 10 to 200 sccm of a fluorinated carbon containing gas such as $CF_4$, and 0 to 100 sccm $O_2$ gas into a reaction chamber at a total pressure between 5 and 300 millitorr, and providing between 100 and 2000 watts source power and between 50 and 2000 watts bias power. The semiconductor process fabricated device (1000) may be held at a temperature between 20 C and 90 C.

In an alternate realization, the planarization layer bulk removal process (1020) may include a wet etch step. For example, in realizations in which the sacrificial planarizing layer (1014) includes SOG, the semiconductor process fabricated device (1000) may be exposed to an aqueous solution of hydrofluoric acid (HF).

In one realization of the instant embodiment, an etch rate of the sacrificial planarizing layer (1014) in the planarization layer bulk removal process (1020) may be higher than during a subsequent selective planarization RIE process. In a further realization, the etch rate of the sacrificial planarizing layer (1014) in the planarization layer bulk removal process (1020) may be more than three times higher than during a subsequent selective planarization RIE process.

Figure 1F:
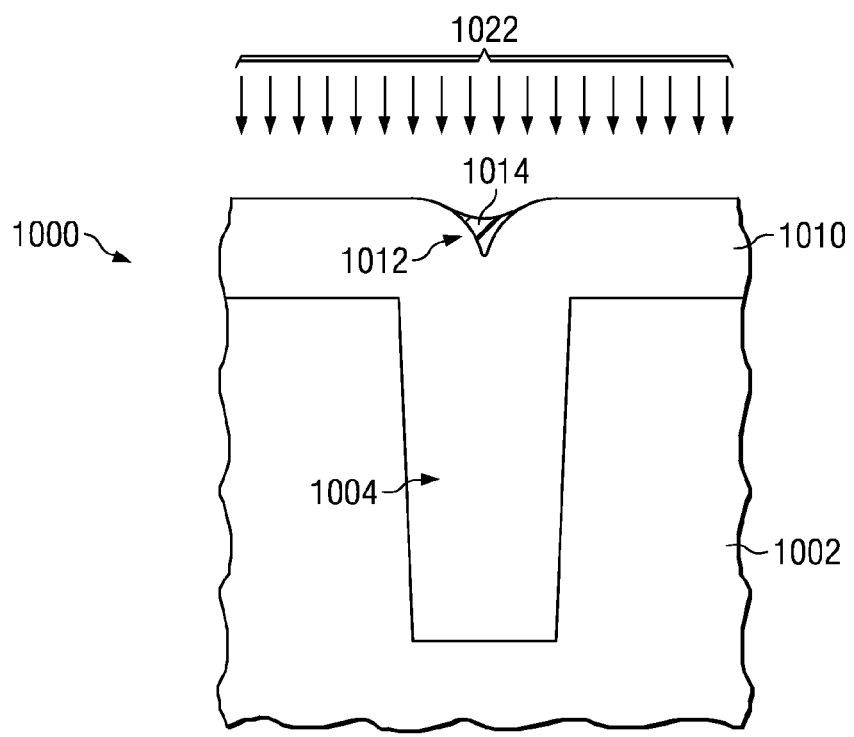

Referring to FIG. 1F, a selective planarization RIE process (1022) is performed which is capable of etching both the sacrificial planarizing layer (1014) and the fill material layer (1010). Process conditions of the selective planarization RIE process (1022) are adjusted so that an etch rate of the fill material layer (1010) is at least five times an etch rate of the sacrificial planarizing layer (1014). In one realization of the instant embodiment, a plasma source for the selective planarization RIE process (1022) may be formed by flowing 10 to 300 sccm of HBr gas, 10 to 300 sccm $Cl_2$ gas, 10 to 100 sccm of a gas mixture of 90% helium and 10% $O_2$, 0 to 100 sccm of a fluorinated carbon containing gas such as $CF_4$, and 0 to 100 sccm $O_2$ gas into a reaction chamber at a total pressure between 5 and 300 millitorr, and providing between 100 and 2000 watts source power and between 50 and 2000 watts bias power. The semiconductor process fabricated device (1000) may be held at a temperature between 20 C and 90 C. Fill material layer (1010) is removed uniformly from an existing top surface of the fill material layer (1010) by the selective planarization RIE process (1022). At a point when the fill material layer (1010) has been substantially removed from areas over the substrate (1002), a portion of the sacrificial planarizing layer (1014) remains in the fill layer depression (1012), as depicted in FIG. 1F.

Figure 1G:
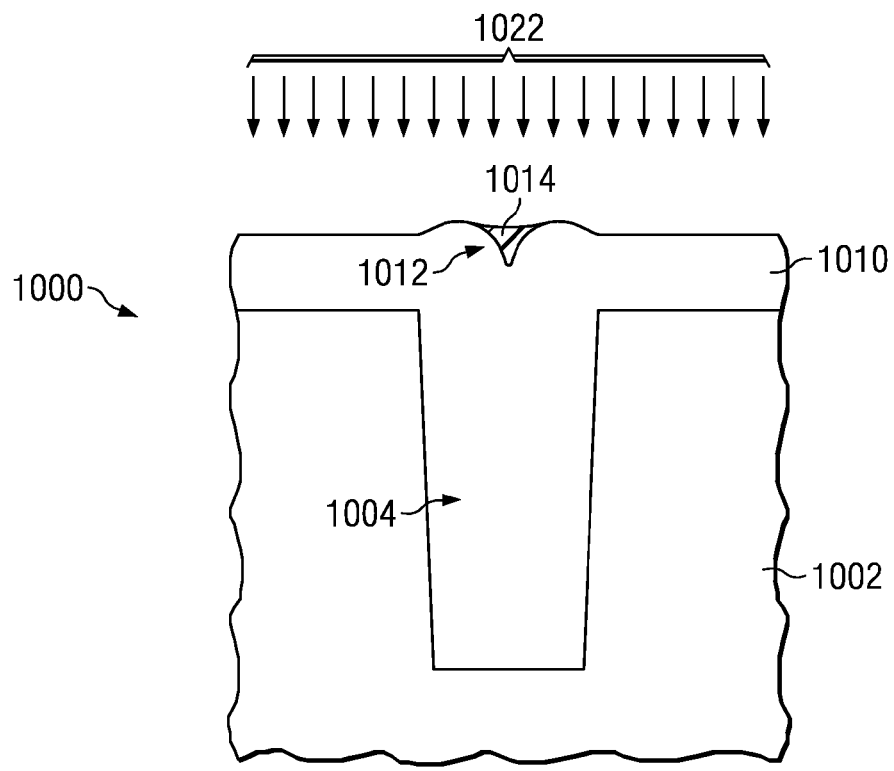

FIG. 1G depicts the semiconductor process fabricated device (1000) at a later stage during performance of the selective planarization RIE process (1022). The selective planarization RIE process (1022) is continued, concurrently etching the fill material layer (1010) in areas over the substrate (1002) and the sacrificial planarizing layer (1014) in the fill layer depression (1012). An existing top surface of the fill material layer (1010) in areas over the substrate (1002) is etched at a faster rate than an existing top surface of the sacrificial planarizing layer (1014), so that the existing top surface of the fill material layer (1010) in areas over the substrate (1002) is lower than the existing top surface of the sacrificial planarizing layer (1014).

Figure 1H:
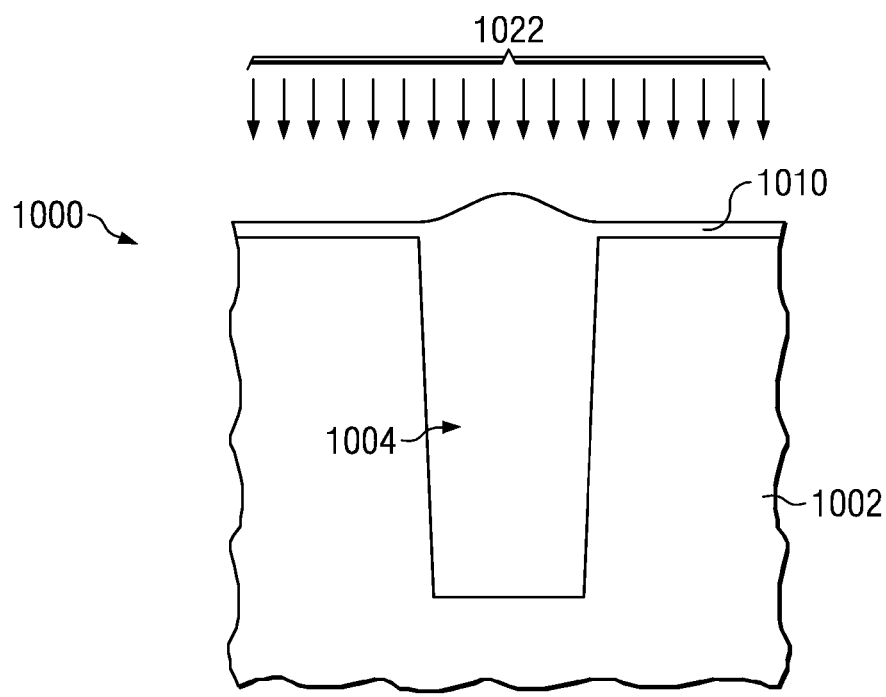

FIG. 1H depicts the semiconductor process fabricated device (1000) after the sacrificial planarizing layer has been removed. An existing top surface of the fill material layer (1010) over the cavity (1004) is higher than an existing top surface of the fill material layer (1010) in areas over the substrate (1002). The selective planarization RIE process (1022) is continued to remove the fill material layer (1010) from the top surface of the substrate (1002) and to planarize the fill material layer (1010) in the cavity (1004).

Figure 1I:
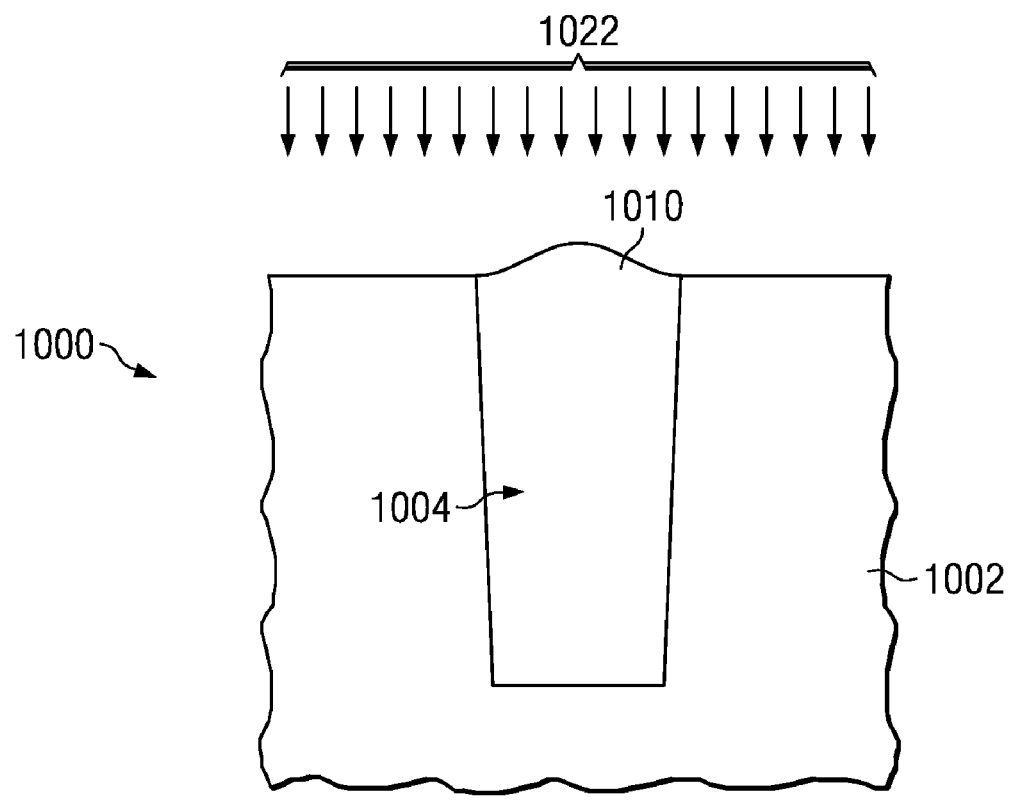

FIG. 1I depicts the semiconductor process fabricated device (1000) as the fill material layer (1010) is removed from the top surface of the substrate (1002). An existing top surface of the fill material layer (1010) over the cavity (1004) is higher than the top surface of the substrate (1002). The selective planarization RIE process (1022) is continued, in a step commonly known as an overetch, to planarize the fill material layer (1010) in the cavity (1004).

Figure 1J:
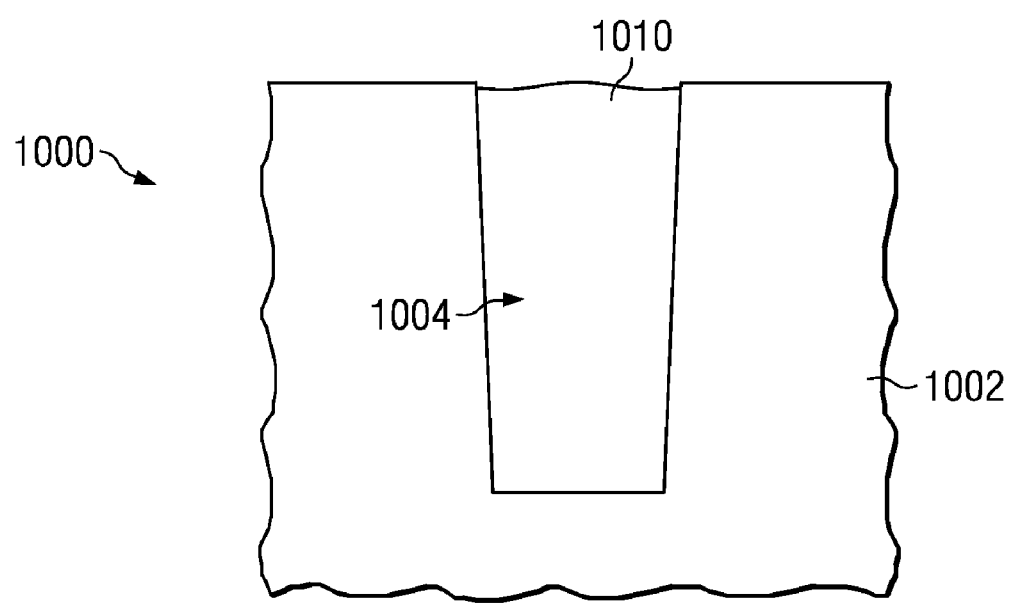

FIG. 1J depicts the semiconductor process fabricated device (1000) after the selective planarization RIE process is completed. A top surface of the fill material layer (1010) in the cavity (1004) is substantially planar.

While various realizations of an embodiment have been described above, it should be understood that they have been presented by way of example only and not limitation. Numerous changes to the disclosed embodiment can be made in accordance with the disclosure herein without departing from the spirit or scope of the invention. Thus, the breadth and scope of the present invention should not be limited by any of the above described realizations. Rather, the scope of the invention should be defined in accordance with the following claims and their equivalents.

What is claimed is:

1. A process of forming a semiconductor process fabricated device, comprising steps:
   providing a substrate;
   forming a cavity in said substrate;
   forming a fill material layer in said cavity and on a top surface of said substrate adjacent to said cavity by a conformal deposition process, such that a fill layer depression is formed in a top surface of said fill material layer over said cavity;
   forming a sacrificial planarizing layer on said top surface of said fill material layer, such that a thickness of said sacrificial planarizing layer over said fill layer depression is greater than a thickness of said sacrificial planarizing layer over said substrate adjacent to said cavity by at least half a depth of said fill layer depression; and
   performing a selective planarization RIE process, such that:
   said sacrificial planarizing layer is etched such that said fill material layer is exposed over said substrate adjacent to said cavity while material of said sacrificial planarizing layer remains in said fill layer depression;
   said fill material layer is subsequently etched concurrently with said sacrificial planarizing layer in said fill layer depression, whereby an etch rate of said fill material layer is at least five times an etch rate of said sacrificial planarizing layer;
   said sacrificial planarizing layer is subsequently removed from said fill layer depression, whereby an existing top surface of said fill material layer over said cavity is higher than an existing top surface of said fill material layer over said substrate adjacent to said cavity;
   said fill material layer is subsequently removed from said top surface of said substrate adjacent to said cavity, whereby an existing top surface of said fill material layer over said cavity is higher than said top surface of said substrate adjacent to said cavity; and
   subsequently continuing said selective planarization RIE process in an overetch step, whereby an existing top surface of said fill material layer over said cavity is substantially planar.

2. The process of claim 1, in which said step of performing said selective planarization RIE process further includes steps:
   flowing 10 to 300 sccm of HBr gas into a reaction chamber;
   flowing 10 to 300 sccm Cl2 gas into said reaction chamber;
   flowing 10 to 100 sccm of a gas mixture of 90% helium and 10% O2 into said reaction chamber;
   flowing 0 to 200 sccm of a fluorinated carbon containing gas into said reaction chamber;
   flowing 0 to 100 sccm O2 gas into said reaction chamber;
   maintaining a total pressure in said reaction chamber between 5 and 300 millitorr;
   providing between 100 and 2000 watts source power and between 50 and 2000 watts bias power to a plasma in said reaction chamber; and
   maintaining said semiconductor process fabricated device at a temperature between 20 C and 90 C.

3. The process of claim 1, in which:
   said cavity is part of a deep trench isolation structure, such that said cavity is a trench more than one micron wide and more than three microns deep; and
   said fill material layer includes polysilicon.

4. The process of claim 1, in which:
   said cavity is part of an STI structure, such that said cavity is a trench less than one micron deep; and
   said fill material layer includes silicon dioxide.

5. The process of claim 1, in which said sacrificial planarizing layer includes photoresist.

6. The process of claim 1, in which said sacrificial planarizing layer includes BARC.

7. The process of claim 1, in which said sacrificial planarizing layer includes SOG.

8. The process of claim 1, further including a step of performing a planarization layer bulk removal process prior to said step of performing said selective planarization RIE process, such that an etch rate of said sacrificial planarizing layer in said planarization layer bulk removal process is more than three times said etch rate of said sacrificial planarizing layer in said selective planarization RIE process.

9. The process of claim 8, in which said step of performing said planarization layer bulk removal process includes steps:

flowing 0 to 300 sccm of a noble gas into a reaction chamber;

flowing 10 to 200 sccm of a fluorinated carbon containing gas into said reaction chamber;

flowing 0 to 100 sccm O2 gas into said reaction chamber;

maintaining a total pressure in said reaction chamber between 5 and 300 millitorr;

providing between 100 and 2000 watts source power and between 50 and 2000 watts bias power to a plasma in said reaction chamber; and maintaining said semiconductor process fabricated device at a temperature between 20 C and 90 C.

10. The process of claim 1, further including a step of performing a smoothing process on a top surface of said sacrificial planarizing layer such that a depth of a depression in said top surface of said sacrificial planarizing layer over said cavity is reduced.

* * * * *